(12) United States Patent
Zheng et al.

(10) Patent No.: US 7,310,265 B2
(45) Date of Patent: Dec. 18, 2007

(54) MAGNETIC MEMORY DEVICE

(75) Inventors: Yuankai Zheng, Singapore (SG); Yihong Wu, Singapore (SG)

(73) Assignee: Agency for Science, Technology and Research, Centros (SG)

( * ) Notice: Subject to any disclaimer, the term of this patent is extended or adjusted under 35 U.S.C. 154(b) by 0 days.

(21) Appl. No.: 10/575,970

(22) PCT Filed: Oct. 12, 2004

(86) PCT No.: PCT/SG2004/000333

§ 371 (c)(1),
(2), (4) Date: Dec. 11, 2006

(87) PCT Pub. No.: WO2005/036558

PCT Pub. Date: Apr. 21, 2005

(65) Prior Publication Data

US 2007/0109838 A1    May 17, 2007

Related U.S. Application Data

(60) Provisional application No. 60/510,836, filed on Oct. 14, 2003.

(51) Int. Cl.
G11C 11/15    (2006.01)
(52) U.S. Cl. .................... 365/158; 365/173
(58) Field of Classification Search .............. 365/157
See application file for complete search history.

(56) References Cited

U.S. PATENT DOCUMENTS 5,953,248 A * 9/1999 Chen et al. .............. 365/158

6,259,644 B1    7/2001 Tran et al.
6,317,375 B1    11/2001 Perner (Continued)

FOREIGN PATENT DOCUMENTS

JP    2002208680    7/2002

(Continued)

OTHER PUBLICATIONS

International Preliminary Report on Patentability and Written Opinion mailed Apr. 27, 2006 in corresponding International PCT application PCT/SG2004/000333.
Beech, R.S. et al. "Curie point written magnetoresistive memory", J. Appl. Phys. 87, No. 9, pp. 6403-6405, May 2000.

(Continued)

Primary Examiner—Tan T. Nguyen
(74) Attorney, Agent, or Firm—Davidson Berquist Jackson & Gowdey LLP

(57) ABSTRACT

A memory cell (310) for a magnetic memory device (300) includes a free layer (311), a cap layer, an antiferromagnetic layer, and a synthetic antiferromagnetic layer which comprises two or more than two ferromagnetic layers that are antiferromagnetically coupled through non-magnetic space layers. The synthetic antiferromagnetic layer is pinned by antiferromagnetic layer. The antiferromagnetic layer and the synthetic antiferromagnetic layer form a synthetic antiferromagnetic pinned (SAFP) recording layer. The magnetization of the SAFP recording layer can be changed by combining a heating process and an external field induced from currents flowing along the bit line (320) and the word line (330). Therefore, a MRAM with high density, high thermal stability, low power dissipation and high heat tolerance can be achieved after introducing the SAFP recording layer due to the high volume and anisotropy energy of the SAFP recording layer.

21 Claims, 9 Drawing Sheets

U.S. PATENT DOCUMENTS

| | | |
|---|---|---|
| 6,341,084 B2 | 1/2002 | Numata et al. |
| 6,385,082 B1 | 5/2002 | Abraham et al. |
| 6,418,048 B1 * | 7/2002 | Sin et al. .................... 365/173 |
| 6,535,416 B1 | 3/2003 | Daughton et al. |
| 6,597,618 B2 | 7/2003 | Zheng et al. |
| 6,728,132 B2 | 4/2004 | Deak |
| 6,946,697 B2 * | 9/2005 | Pietambaram et al. ...... 257/295 |
| 2002/0089874 A1 | 7/2002 | Nickel et al. |
| 2003/0198113 A1 | 10/2003 | Abraham et al. |

FOREIGN PATENT DOCUMENTS

| | | |
|---|---|---|
| JP | 2002208681 | 7/2002 |
| WO | WO 03/077257 A1 | 9/2003 |

OTHER PUBLICATIONS

Fullerton, Eric E. et al. "Antiferromagnetically coupled magnetic media layers for thermally stable high-density recording", Applied Physics Letters, vol. 77, No. 23, pp. 3806-3808, Dec. 4, 2000.

Zheng, Y.K. et al. "High-thermal stability MRAM with SAF layer", IEEE Trans. MAG 40, No. 4, pp. 2248-2250, Jul. 2004.

International Search Report mailed Jan. 6, 2004 in corresponding International Application No. PCT/SG2004/000333.

Written Opinion mailed Jan. 6, 2005 in corresponding International Application No. PCT/SG2004/000333.

* cited by examiner

MAGNETIC MEMORY DEVICE

FIELD OF THE INVENTION

The present invention relates to a magnetic memory device. In particular, it relates to a magnetoresistive random access memory device with a synthetic antiferromagnetic pinned multi-layer that writes data by thermal assisted techniques.

BACKGROUND OF THE INVENTION

Magnetoresistive random access memory (MRAM) devices are solid state, non-volatile memory devices which make use of the giant magnetoresistive effect. A conventional MRAM device includes a column of first electrical wires, referred to as word lines, and a row of second electrical wires, referred to as bit lines. An array of magnetic memory cells, located at the junctions of the word lines and bit lines, is used to record data signals.

A typical magnetic memory cell comprises a hard magnetic layer, a soft magnetic layer, and a non-magnetic layer sandwiched between the hard magnetic layer and the soft magnetic layer. The hard magnetic layer has a magnetization vector fixed in one direction. The orientation of the magnetization vector does not change under a magnetic field applied thereon. The soft magnetic layer has an alterable magnetization vector under a magnetic field applied thereon, that either points to the same direction, hereinafter "parallel alignment", or to the opposite direction, hereinafter "antiparallel alignment", of the magnetization vector of the hard magnetic layer. Since the resistances of the magnetic memory cell in the "parallel alignment" status and the "antiparallel alignment" status are different, the two types of alignment status can be used to record the two logical states—the "0"s or "1"s of a data bit.

In a writing operation, an electric current passes through the word line and the bit line adjacent to the memory cell. When the electric current reaches a certain threshold, a magnetic field generated by the electric current will switch the orientation of the magnetization vector of the soft magnetic layer. As a result, the magnetization vector of the hard magnetic layer and the soft magnetic layer will be changed from one type of alignment, e.g. "parallel alignment", to the other type of alignment, e.g. "antiparallel alignment", so that a data signal in form of one data bit can be recorded in the memory cell.

In MRAM structure design, a lower writing power dissipation and a higher cell density are most desired. Unfortunately, a reduction of cell size, i.e. an increase in cell density, will lead to a reduction in the available energy ($K_uV$) to store the bit message. Further, the error rate increases very rapidly as the cell size scales down. However, in order to reduce the error rate, high anisotropy energy is required to overcome thermal fluctuations. Hard magnetic material has higher anisotropy energy compared with soft magnetic material, but in that case a higher writing current is required. The higher anisotropy energy results in higher writing current density, which unfortunately has the disadvantage of electromigration.

In order to reduce the writing current for a high coercitivity MRAM, thermally assisted MRAMs are disclosed in U.S. Pat. No. 6,385,082, U.S. patent application 20020089874, JP patent application 2002208680, and JP patent application 2002208681. Un-pinned ferromagnetic materials, in which the coercitivity decreases sharply as temperature increases, are used for the recording layer in the MRAMs disclosed therein.

In order to increase the thermal stability of the magnetic memory cell, recently, a Curie point written MRAM has been proposed to improve the stability of MRAM, as described in U.S. Pat. No. 6,535,416, and in a paper by R. S. Beech et al.: "Curie point written magnetoresistive memory" in J. Appl. Phys. 87, No. 9, pp. 6403-6405, 2000. In the Curie point written MRAM structure, a single pinned layer is used as storage layer. The pinned layer has a higher anisotropy than an unpinned layer. The use of the pinned layer for information storage provides improved thermal stability, allowing the cell size to be reduced before thermal instability becomes a limiting factor.

In order to increase the MRAM cell density, the MRAM structure can be simplified as mentioned in U.S. Pat. No. 6,597,618, U.S. Pat. No. 6,341,084, U.S. Pat. No. 6,317,375 and U.S. Pat. No. 6,259,644.

In analogy to a conventional single-layered magnetic media, thermal stability can be improved by introduction of antiferromagnetically coupled magnetic layers as the magnetic memory cell size decreases further (see, e.g., E. E. Fullerton et al.: "Antiferromagnetically coupled magnetic media layers for thermally stable high-density recording" in Appl. Phys. Lett. 77, No. 23, p. 3806, 2000).

OBJECT OF THE INVENTION

Accordingly it is an object of the present invention to provide a MRAM with high thermal stability, low power dissipation, and high heat tolerance during thermal assistant writing.

SUMMARY OF THE INVENTION

In a first embodiment of the present invention, a high thermal stable magnetoresistive random access memory (MRAM) unit is presented. The MRAM unit includes a substrate, a plurality of memory cells formed on the substrate, and a plurality of electrical wires electrically coupled to the plurality of memory cells. Each of the plurality of memory cells includes a synthetic antiferromagnetic pinned (SAFP) recording layer, the SAFP recording layer itself including two or more antiferromagnetically coupled ferromagnetic layers pinned by at least one antiferromagnetic (AFM) layer. The plurality of memory cells together with the plurality of electrical wires are adapted to conduct a heating current therethrough, thereby heating a respective one of said plurality of memory cells. Each of the plurality of electrical wires is adapted to conduct writing currents therethrough, the writing currents operable to change the magnetization of the SAFP recording layer for the respective heated memory cell.

In a second embodiment of the present invention, a method for writing data in a MRAM unit is presented. In this embodiment, the MRAM unit includes a plurality of memory cells, a bit line and a word line, the bit and word lines being in electrical contact with the plurality of memory cells. Each memory cell includes a SAFP recording layer, and each SAFP recording layer includes two or more antiferromagnetically coupled ferromagnetic layers pinned by at least one antiferromagnetic layer. The method includes the operation of raising the temperature of the SAFP recording layer in an individual memory cell to approach or exceed its critical temperature independently of other memory cells, thereby easily changing the magnetization of the particular memory cell's SAFP recording layer. The method further includes the operation of writing a magnetization state in the SAFP recording layer of the individual memory cell by passing a first current completely through the bit line and by passing a second current completely through the word line.

In a third embodiment of the present invention, a method for performing a read operation in a MRAM unit is presented. In this embodiment, the MRAM unit includes a plurality of memory cells, a bit line and a word line, the bit and word lines being in electrical contact with the plurality of memory cells. Each memory cell includes a SAFP recording layer and a free magnetic layer, and each SAFP recording layer includes two or more antiferromagnetically coupled ferromagnetic layers pinned by at least one antiferromagnetic layer. The method includes the operation of applying currents through the bit line and the word line. The method further includes the operation of determining the magnetization state of the SAFP recording layer, wherein the resistance states of the SAFP recording layer are dependent on the relative angles between the magnetization vectors of said SAFP recording layer and said free magnetic layer.

These and other features of the present invention will be better understood when viewed in light of the following drawings and detailed description.

DETAILED DESCRIPTION OF SPECIFIC EMBODIMENTS

It is pointed out that in the present application the term "critical temperature" is substantially the blocking temperature for antiferromagnetic (AFM) material, which can be less than the Néel temperature. The critical temperature is substantially the Curie temperature for ferromagnetic material. The blocking temperature of an AFM layer is the temperature at or above which the AFM layer loses its ability to "pin" (i.e. fix) the magnetization of an adjacent ferromagnetic layer below the Curie temperature of the adjacent ferromagnetic layer.

Figure 1A:
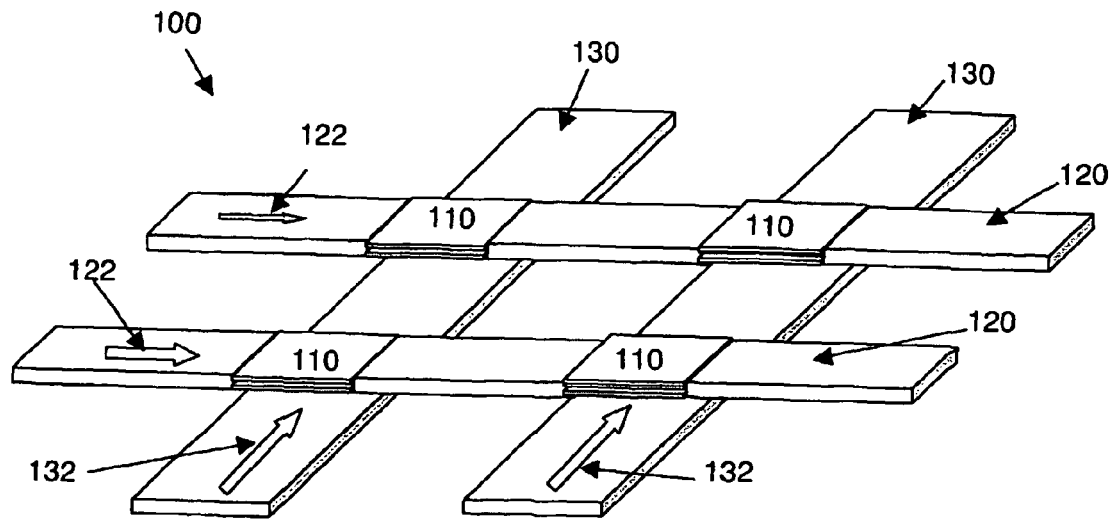
FIG. 1A is a partially enlarged perspective view showing a conventional CIP SV MRAM device.
Figure 1B:
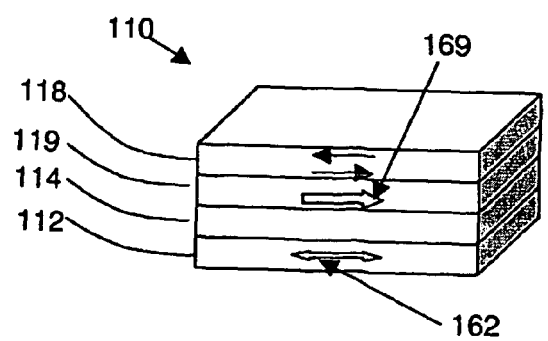
FIG. 1B is an enlarged view showing a memory cell of the MRAM device shown in FIG. 1A.

As shown in FIGS. 1A and 1B, a conventional current-in-plane (CIP) spin-valve (SV) MRAM device 100 comprises a plurality of memory cells 110, a row of bit lines 120 passing through the memory cells 110 and a column of word lines 130 passing underneath the memory cells 110. An exemplary memory cell 110 as shown in FIG. 1B comprises a first magnetic layer 112 made of ferromagnetic material such as CoFe and/or NiFe, a non-magnetic layer 114 made of non-magnetic material such as Cu, a second magnetic layer 119 made of ferromagnetic material such as CoFe and/or NiFe, and an antiferromagnetic (AFM) layer 118 made of AFM material such as IrMn, FeMn and/or PtMn, etc. The above layers are disposed in sequence as shown in FIG. 1B. The second magnetic layer 119 has a fixed magnetization vector 169 pointing rightwardly, for example, which does not change its direction under an external magnetic field, hereinafter pinned layer. The AFM layer 118 serves to fix the magnetization of the second magnetic layer 119.

In a first case, the first magnetic layer 112 is configured to be a free layer as a recording layer having its magnetization vector 162 alterable under an external magnetic field. During a writing process, a word line current 132 passing underneath the cell 110 and a bit line current 122 passing through the memory cell 110 generate corresponding magnetic field changes the orientation of the magnetization vector 162 of the first magnetic layer 112, to point either to the right or to the left. When pointing to the right, the magnetization vector 162 becomes parallel to the magnetization vector 169 (of the second magnetic layer 119), which represents a low magnetic resistance state of the memory cell 110. When pointing to the left, the magnetization vector 162 is antiparallel to the magnetization vector 169 (of the second magnetic layer 119), which represents a high magnetic resistance state of the memory cell 110. The "low" and "high" states correspond to binary data bits "0" and "1" by which a data signal may be stored in the memory cell.

In a second case of thermal assistant writing, the first magnetic layer 112 is configured to be a free layer serving as reading layer having its magnetization vector 162 alterable under an external magnetic field. The second magnetic layer 119 is configured to be a pinned layer serving as recording layer having its magnetization vector 162 alterable under an external magnetic field after heating. During a writing process, a bit line current 122 passes through the memory cell 110 to heat it, and a word line current 132 passes underneath the memory cell 110 to generate together with the bit line current 122 a corresponding magnetic field that changes the orientation of the magnetization vector 169 of the second magnetic layer 119 to point either to the right or to the left. During a reading process, an alterable external magnetic field is applied to the memory cell 110 changing the magnetization vector 162 of the first magnetic layer 112 to be the initial state oriented to the left for the resistance detecting method or firstly oriented to the left and then changing to the right for the resistance change detecting method. When the magnetization vector 169 points to the left, the magnetization vector 162 of the first magnetic layer 112 becomes parallel to the magnetization vector 169 of the second magnetic layer 119, which represents a low magnetic resistance state of the memory cell 110. When the magnetization vector 169 point to the right, the magnetization vector 162 of the first magnetic layer 112 is antiparallel to the magnetization vector 169 of the second magnetic layer 119, which represents a high magnetic resistance state of the memory cell 110. The "low" and "high" magnetic resistance states correspond to binary data bits "0" and "1" by which a data signal may be stored in the memory cell 110.

Figure 2A:
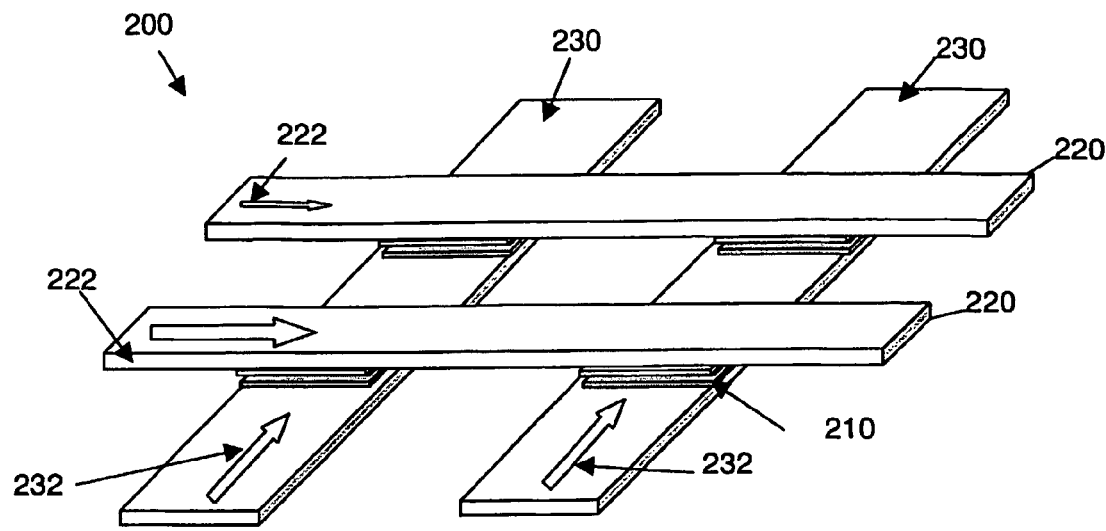
FIG. 2A is a partially enlarged perspective view showing a conventional CPP type device such as MTJ and CPP SV MRAM.
Figure 2B:
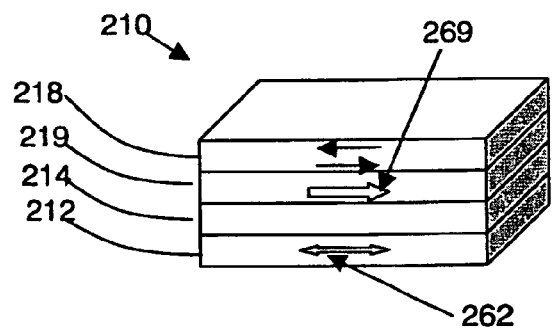
FIG. 2B is an enlarged view showing a memory cell of the MRAM device shown in FIG. 2A.

FIGS. 2A and 2B show a conventional current-perpendicular-to-plane (CPP) MRAM device 200 which comprises a plurality of memory cells 210, a row of bit lines 220 passing above the memory cells 210 and a column of word lines 230 passing underneath the memory cells 210. An exemplary memory cell 210 as shown in FIG. 2B comprises a first magnetic layer 212 made of ferromagnetic material such as CoFe and/or NiFe, a non-magnetic layer 214 made of non-magnetic material such as Cu for CPP SV or insulator material such as AlO for magnetic tunnel junction (MTJ), a second magnetic layer 219 made of ferromagnetic material such as CoFe and/or NiFe, and an AFM layer 218 made of AFM material such as IrMn, FeMn and/or PtMn, etc. The above layers are disposed in sequence as shown in FIG. 2B. The second magnetic layer 219 has a fixed magnetization vector 269 pointing rightwardly. The AFM layer 218 serves to fix the magnetization of the second magnetic layer 219.

In a first case, the first magnetic layer 212 is configured to be a free layer as a recording layer having its magnetization vector 262 alterable under an external magnetic field. During a writing process, a word line current 232 passing underneath the cell 110 and a bit line current 122 passing through the memory cell 210 generate corresponding magnetic field changes the orientation of the magnetization vector 262 of the first magnetic layer 212, to point either to the right or to the left. When pointing to the right, the magnetization vector 262 becomes parallel to the magnetization vector 269 (of the second magnetic layer), which represents a low magnetic resistance state of the memory cell 210. When pointing to the left, the magnetization vector 262 is antiparallel to the magnetization vector 169 (of the second magnetic layer), which represents a high magnetic resistance state of the memory cell 210. The "low" and "high" states correspond to binary data bits "0" and "1" by which a data signal may be stored in the memory cell.

In a second case of thermal assistant writing, the first magnetic layer 212 is configured to be a free layer serving as reading layer and having its magnetization vector 262 alterable under an external magnetic field. The second magnetic layer 219 is configured to be a pinned layer serving as recording layer having its magnetization vector 269 alterable under an external magnetic field after heating. During a writing process, a heating current passes through a selected memory cell 210 and heats it, and then a word line current 232 passes underneath the memory cell 210 and a bit line current 222 passes above the memory cell 210 to generate a corresponding magnetic field that changes the orientation of the magnetization vector 269 of the second magnetic layer 219 to point either to the right or to the left. During a reading process, an alterable external magnetic field is applied to the memory cell 210 changing the magnetization vector 262 of the first magnetic layer 212 to be the initial state oriented to the left for the resistance detecting method or firstly oriented to the left and then changing to the right for the resistance change detecting method. When the magnetization vector 269 points to the left, the magnetization vector 262 of the first magnetic layer 212 becomes parallel to the magnetization vector 269 of the second magnetic layer 219, which represents a low magnetic resistance state of the memory cell 210. When the magnetization vector 269 points to the right, the magnetization vector 262 of the first magnetic layer 212 is antiparallel to the magnetization vector 269 of the second magnetic layer 219, which represents a high magnetic resistance state of the memory cell 210. The "low" and "high" magnetic resistance states correspond to binary data bits "0" and "1" by which a data signal may be stored in the memory cell 210.

Figure 3A:
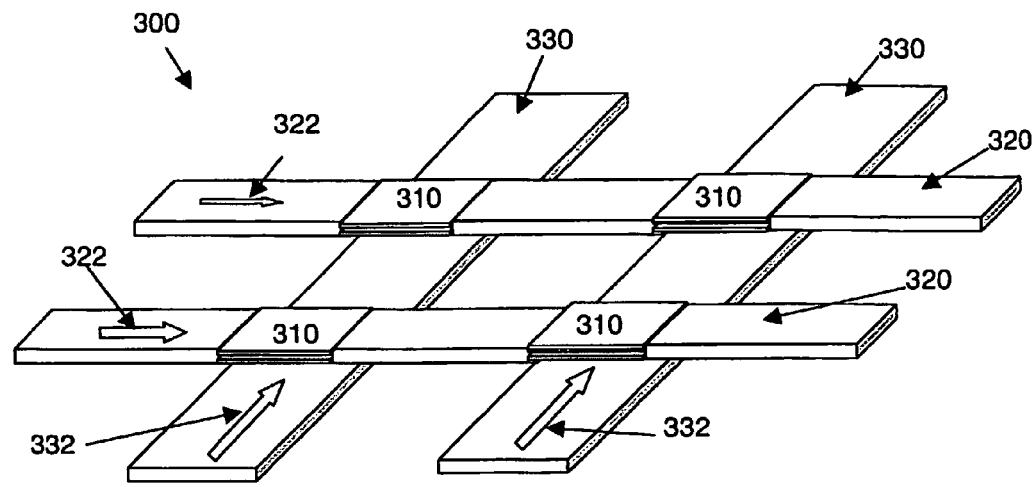
FIG. 3A is a partially enlarged perspective view showing a CIP SV MRAM device according to a first embodiment of the present invention.
Figure 3B:
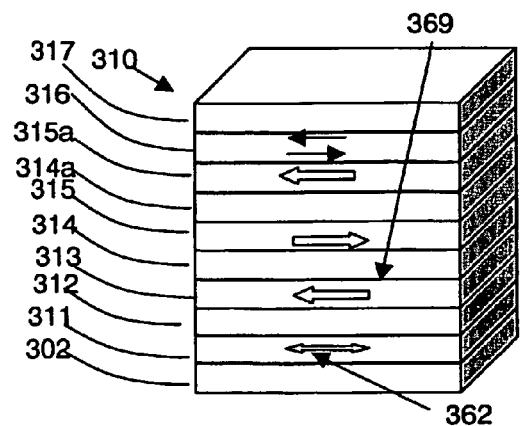
FIG. 3B is an enlarged view showing a memory cell of the MRAM device shown in FIG. 3A.

FIGS. 3A and 3B show a current-in-plane (CIP) spin-valve (SV) MRAM device 300 for a magnetic memory device according to a first embodiment of the present invention, which CIP SV MRAM device 300 comprises a plurality of memory cells 310, a row of bit lines 320 passing through the memory cells 310 and a column of word lines 330 passing underneath the memory cells 310. Each memory cell 310 according to the first embodiment of the present invention and shown in FIG. 3B comprises a template layer 302, a free magnetic layer 311, a first non-magnetic layer 312, a first ferromagnetic layer 313, a first non-magnetic space layer 314, a second ferromagnetic layer 315, a second non-magnetic space layer 314a, a third ferromagnetic layer 315a, an antiferromagnetic (AFM) layer 316, and a cap layer 317. The above layers are disposed in sequence as shown in FIG. 3B. Therefore, each of the first and second non-magnetic space layers 314, 314a is sandwiched between two neighboring ones of the first, second and third ferromagnetic layers 313, 315, 315a.

The free magnetic layer 311 serves as reading layer to detect the magnetization state of the first, second and third ferromagnetic layers 313, 315, 315a which serve together as recording layer to store data, and has its magnetization vector 362 alterable under an external magnetic field after heating. During a writing process, a bit line current 322 passes through the memory cell 310 to heat it, then a word line current 332 passes underneath the memory cell 310 and the bit line current 322 passes further through the memory cell 310 to generate a corresponding magnetic field that changes the orientation of the magnetization vector 369 of the first ferromagnetic layer 313 to point either to the right or to the left. Due to the antiferromagnetic coupling of the first, second and third ferromagnetic layers 313, 315, 315a forming antiferromagnetic coupled ferromagnetic layers, the orientations of the magnetization vectors of the second and third ferromagnetic layers 315, 315a are adjusted depending on the orientation of the magnetization vector 369 of the first ferromagnetic layer 313. During a reading process, an alterable external magnetic field is applied to the memory cell 310 changing the magnetization vector 362 of the free magnetic layer 311 to be the initial state oriented to the left for the resistance detecting method or firstly oriented to the left and then changing to the right for the resistance change detecting method. When the magnetization vector 369 points to the left, the magnetization vector 362 of the free magnetic layer 311 becomes parallel to the magnetization vector 369 of the first ferromagnetic layer 313, which represents a low magnetic resistance state of the memory cell 310. When the magnetization vector 369 points to the right, the magnetization vector 362 of the free magnetic layer 311 is antiparallel to the magnetization vector 369 of the first ferromagnetic layer 313, which represents a high magnetic resistance state of the memory cell 310. The "low" and "high" magnetic resistance states correspond to binary data bits "0" and "1" by which a data signal may be stored in the memory cell 310. The different resistance states which are detectable via an appropriate electronic circuit (not shown in the present application) represent the different magnetization states in the MRAM device 300, and the different magnetization states in one memory cell 310 represent one data bit of a data signal stored in the MRAM device 300.

In this structure, the first, second and third ferromagnetic layers 313, 315, and 315a are pinned layers, which serve as recording layer and which are coupled antiferromagnetically through the first and second space layers 314 and 314a. The free magnetic layer 311, and the first, second and third ferromagnetic layers 313, 315, and 315a can be magnetic material such as Ni, Fe, Co, or their alloys. The first and second space layers 314 and 314a can be Ru, Rh, Cr, C, B, Ta, etc. or their alloys. The first non-magnetic layer 312 can be non-magnetic material such as Cu, Au, etc. The magnetization vector of the third ferromagnetic layer 315a is fixed through exchange coupling with the AFM layer 316. The AFM layer 316 can be made of AFM material such as IrMn, FeMn and/or PtMn, etc. Alternatively to the AFM layer 316, also a hard magnetic layer made of high coercitivity magnetic material such as TbCo, DyCo, TbDyCo, CrCoPt, etc. can be used. The AFM layer 316 and the antiferromagnetically coupled first, second and third ferromagnetic layers 313, 315, 315a form a synthetic antiferromagnetic pinned (SAFP) multi-layer to be used as SAFP recording layer. When the temperature of the memory cell 310 has reached a value which approaches or exceeds the critical temperature of the AFM material, an external field induced from currents passing through the bit line 320 and the word line 330, respectively, can change the pinned magnetization vector direction of each of the first, second and third ferromagnetic layers 313, 315, and 315a. The critical temperature of the AFM material depends on the thickness of the AFM layer 316 and lies in the range of 100° C. and 230° C. for the AFM material IrMn. The pinned magnetization vector directions can be detected via the resistance or a resistance change. As the first, second and third ferromagnetic layers 313, 315, and 315a are coupled antiferromagnetically, a large pinning field or a large anisotropy energy and a high storage volume can be achieved in this structure. Thus, a high density MRAM with high thermal stability can be realized. Furthermore, more pinned layers, which are coupled antiferromagnetically with the mentioned SAFP multi-layer, can be inserted to increase the recording density. As the temperature increases, there is diffusion at the interface between the AFM layer 316 and the third ferromagnetic layer 315a. The diffusion may affect the fatigue properties of the MRAM. However, the first and second space layers 314 and 314a can resist the diffusion and improve the fatigue properties of the MRAM. Further details on reducing the diffusion can be found in Y. K. Zheng et al.: "High thermal stability MRAM with SAF layer" in IEEE Trans. MAG. 40, No. 4, pp. 2248-2250, 2004, the disclosure of which is incorporated herein in its entirety. Also, the thin effective thickness of the SAFP multi-layer benefited from the antiferromagnetically coupled first, second and third or more ferromagnetic layers can reduce the switch field when the memory cell 310 size scales down. Thus, the power dissipation can be reduced in the SAFP MRAM.

Since the first, second and third ferromagnetic layers 313, 315, 315a serve together as SAFP recording layer, their individual magnetization vectors can be represented by a common magnetization vector of the recording layer.

The template layer 302 is a seed layer enabling the deposition of the free layer 311 with nearly ideal crystal structure. The cap layer 317 is a protecting layer, which can further improve the giant magnetoresistive effect of the memory cell 310.

Figure 4A:
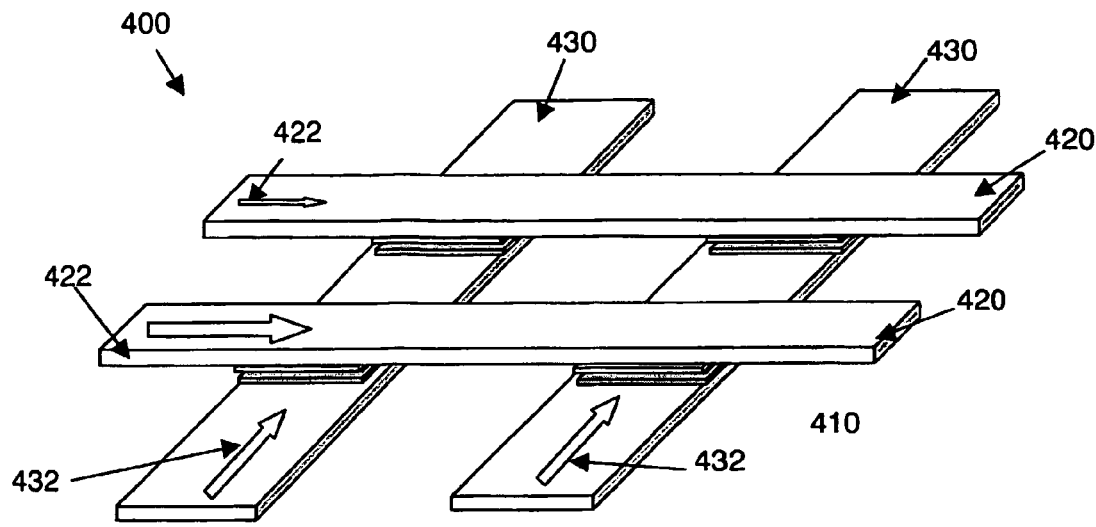
FIG. 4A is a partially enlarged perspective view showing a CPP type device such as MTJ and CPP SV MRAM according to a second embodiment of the present invention.
Figure 4B:
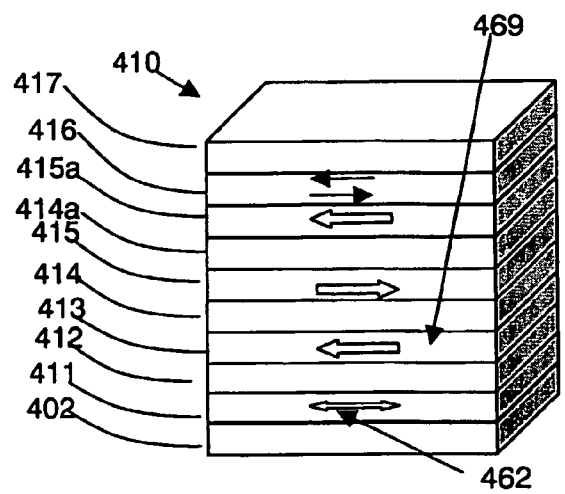
FIG. 4B is an enlarged view showing a memory cell of the MRAM device shown in FIG. 4A.

FIGS. 4A and 4B show a current-perpendicular-to-plane (CPP) MRAM device 400 for a magnetic memory device according to a second embodiment of the present invention, which CPP MRAM device 400 comprises a plurality of memory cells 410, a row of bit lines 420 passing above the memory cells 410 and a column of word lines 430 passing underneath the memory cells 410. Each memory cell 410 according to the second embodiment of the present invention comprises a template layer 402, a free magnetic layer 411, a first non-magnetic layer 412, a first ferromagnetic layer 413, a first non-magnetic space layer 414, a second ferromagnetic layer 415, a second non-magnetic space layer 414a, a third ferromagnetic layer 415a, an antiferromagnetic (AFM) layer 416, and a cap layer 417. The above layers are disposed in sequence as shown in FIG. 4B. Therefore, each of the first and second non-magnetic space layers 414, 414a is sandwiched between two neighboring ones of the first, second and third ferromagnetic layers 413, 415, 415a.

The free magnetic layer 411 serves as reading layer to detect the magnetization state of the first, second and third ferromagnetic layers 413, 415, 415a, and has its magnetization vector 462 alterable under an external magnetic field, and the first ferromagnetic layer 413 is configured to be a pinned layer serving as recording layer having its magnetization vector 469 alterable under an external magnetic field after heating. During a writing process, a heating current passes through a selected memory cell 410 and heats it, and then a word line current 432 passes underneath the memory cell 410 and a bit line current 422 passes above the memory cell 410 to generate a corresponding magnetic field that changes the orientation of the magnetization vector 469 of the first ferromagnetic layer 413 to point either to the right or to the left. Due to the antiferromagnetic coupling of the first, second and third ferromagnetic layers 413, 415, 415a, the orientations of the magnetization vectors of the second and third ferromagnetic layers 415, 415a are adjusted depending on the orientation of the magnetization vector 469 of the first ferromagnetic layer 413. During a reading process, an alterable external magnetic field is applied to the memory cell 410 changing the magnetization vector 462 of the free magnetic layer 411. When pointing to the left, the magnetization vector 462 of the free magnetic layer 411 becomes parallel to the magnetization vector 469 of the first ferromagnetic layer 413, which represents a low magnetic resistance state of the memory cell 410. When pointing to the right, the magnetization vector 462 of the free magnetic layer 411 is antiparallel to the magnetization vector 469 of the first ferromagnetic layer 413, which represents a high magnetic resistance state of the memory cell 410. The changes from "low" to "high" magnetic resistance states and from "high" to "low" magnetic resistance states correspond to binary data bits "0" and "1" by which a data signal may be stored in the memory cell 410.

In this structure, the first, second and third ferromagnetic layers 413, 415, and 415a are pinned layers, which serve as recording layer and which are coupled antiferromagnetically through the first and second space layers 414 and 414a. The free magnetic layer 411, and the first, second and third ferromagnetic layers 413, 415, and 415a can be magnetic material such as Ni, Fe, Co, or their alloys. The first and second space layers 414 and 414a can be Ru, Rh, Cr, C, B, Ta, etc. or their alloys. The first non-magnetic layer 412 can be a conducting layer such as Cu, Au, etc. for CPP SV MRAM, or an insulator layer such as $AlO_x$, $ZnO_x$, $TaO_x$, etc. for magnetic tunnel junction (MTJ) MRAM. The magnetization vector of the third ferromagnetic layer 415a is fixed through exchange coupling with the AFM layer 416. The AFM layer 416 can be made of AFM material such as IrMn, FeMn and/or PtMn, etc. Alternatively to the AFM layer 416, also a hard magnetic layer made of high coercivity magnetic material such as TbCo, DyCo, TbDyCo, CrCoPt, etc. can be used. When the temperature has reached a value which approaches or exceeds the critical temperature of the AFM material, an external field induced from currents passing through the bit line 420 and the word line 430, respectively, can change the pinned magnetization vector direction of each of the first, second and third ferromagnetic layers 413, 415, and 415a. And the pinned magnetization vector direction can be detected through the resistance or a resistance change. The first, second and third ferromagnetic layers 413, 415, and 415a with the AFM layer 416 form a synthetic antiferromagnetic pinned (SAFP) multi-layer. High density, high thermal stability, low power dissipation and high heat tolerance can be achieved due to the high anisotropy energy and large volume of the SAFP multi-layer. Further density increment can be achieved by inserting more pinned layers, which are antiferromagnetically coupled with the SAFP multi-layer.

Since the first, second and third ferromagnetic layers 413, 415, 415a serve together as SAFP recording layer, their individual magnetization vectors can be represented by a common magnetization vector of the recording layer.

The template layer 402 is a seed layer enabling the deposition of the free layer 411 with nearly ideal crystal structure. The cap layer 417 is a protecting layer, which can further improve the giant magnetoresistive effect of the memory cell 410.

For further details of the memory cell 410 of the second embodiment of the present invention please refer to the analogous description of the memory cell 310 of the first embodiment of the present invention.

Figure 5A:
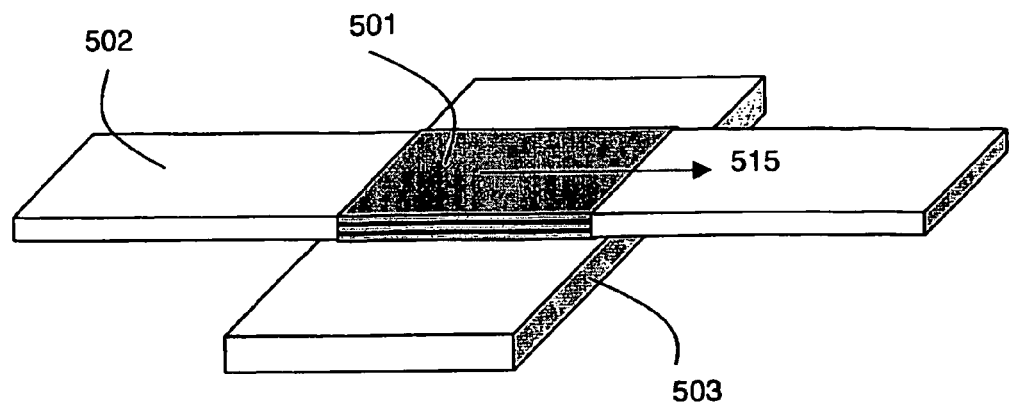
FIG. 5A is a schematic view of a CIP SV MRAM structure heated by a current along a bit line through a memory cell in accordance with the first embodiment of the present invention.
Figure 5B:
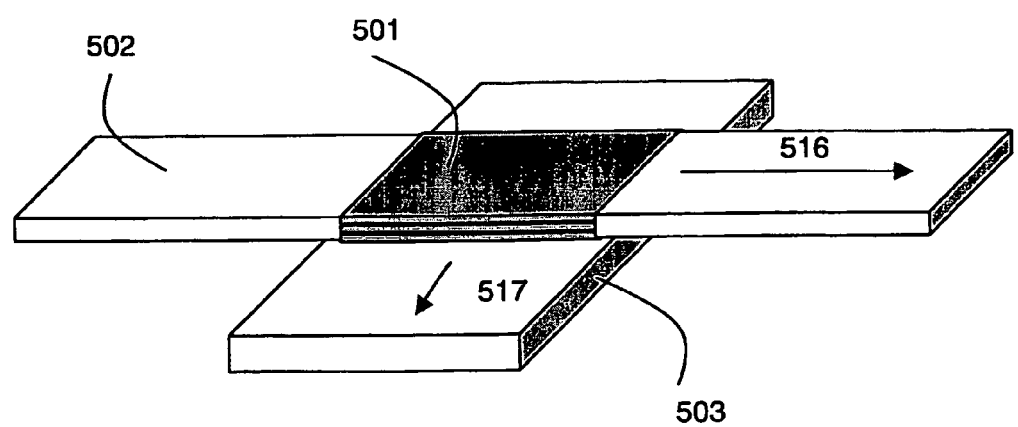
FIG. 5B is a schematic view of the memory cell's writing by applying the current along the bit lines and the word lines after the memory cell is heated in accordance with the first embodiment of the present invention.

Referring now to FIGS. 5A and 5B, the writing operation of magnetization states in a CIP SV MRAM unit in accordance with the first embodiment of the present invention is shown.

In FIG. 5A there is shown a memory cell 501 which is already described in detail in FIG. 3B as memory cell 310, a bit line 502 and a word line 503. The memory cell 501 is heated by current 515 present along the bit line 502. In a typical MRAM unit, the memory cell 501 is formed on a substrate (not shown) of the MRAM unit. The bit line 502 and the word line 503, which are electrically conductive layers, are also formed on the substrate.

Referring to FIG. 5A, in operation, the memory cell 501 is heated by applying a current 515 through the memory cell 501 along the bit line 502. When the temperature of the recording layer approaches or exceeds the critical temperature (the critical temperature being the blocking temperature of the AFM layer or being the Curie temperature of the hard magnetic layer, respectively, in the specific embodiments), the coercivity of the AFM layer/hard magnetic layer will decrease to near zero, and the AFM layer/hard magnetic layer will loose its function of pinning the common magnetization vector of the recording layer. A small magnetic field induced by writing currents 516, 517 in the bit line 502 and the word line 503, respectively, will change the direction of the common magnetization vector of the recording layer (compare description of FIG. 5B). After the temperature of the heated memory cell 501 drops to ambient temperature, the common magnetization vector of the recording layer will be maintained to the set direction. The memory cell 501 is stable with respect to the recorded magnetization due to the high anisotropy energy reached again after cooling down the memory cell 501 to ambient temperature.

Referring now to FIG. 5B, there is shown a writing process to the memory cell 501. After the memory cell 501 is heated, the memory cell's switching field reduces as described with reference to FIG. 5A. Currents 516 and 517, applied along the bit line 502 and the word line 503, respectively, will induce a magnetic field, causing the recording layer's common magnetization vector to be changed. As it would be known to one of ordinary skill in the art, the degree of change of the common magnetization vector will depend on the amount of current applied and the magnitude of the induced magnetic field. According to the invention, the combined application of a heating current heating the memory cell 501 and of writing currents switching the common magnetization vector of the recording layer of the memory cell 501 results in a considerable decrease in necessary writing current intensity. The recording layer is a SAFP layer and the reading layer is a free magnetic layer or a pinned layer made of soft magnetic material, which has a higher critical temperature than the SAFP recording layer. In the heat assisted writing to the MRAM unit, the memory cell can be written with small writing currents just after the heating process due to the reduced barrier energy height in the heated SAFP recording layer.

Figure 6A:
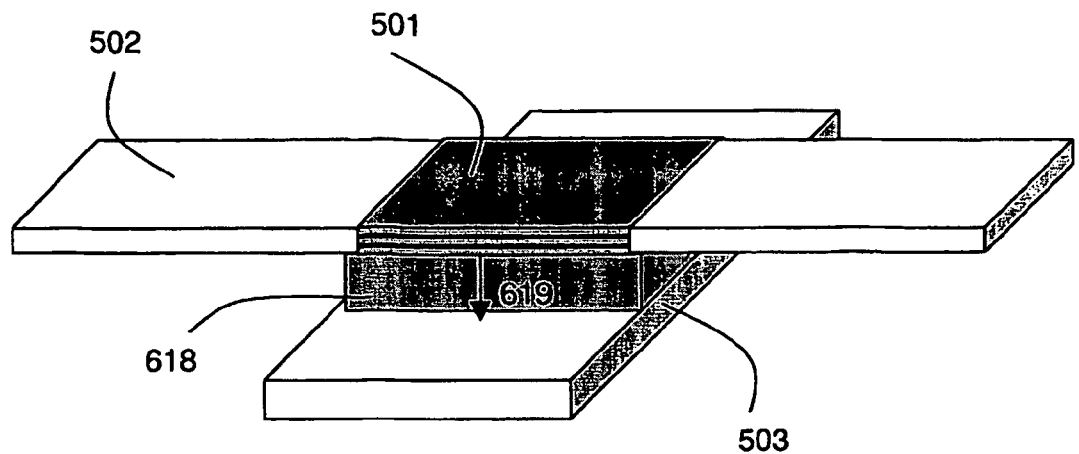
FIG. 6A is a schematic view of a CIP SV MRAM structure heated by a current through a heat element under a memory cell in accordance with a third embodiment of the invention.

In a third embodiment of the present invention, a heat element 618 is provided under the memory cell 501 of the first embodiment of the present invention, as shown in FIG. 6A for a CIP SV MRAM structure. Therefore, a description of the already described components of the memory cell 501 of the first embodiment of the present invention is omitted. In order to heat the memory cell 501 independently, the heat element 618 may be placed under or above the memory cell 501. When a voltage is applied between the bit line 502 and the word line 503, a current 619 will heat the heat element 618, which will in turn heat the memory cell 501.

Figure 6B:
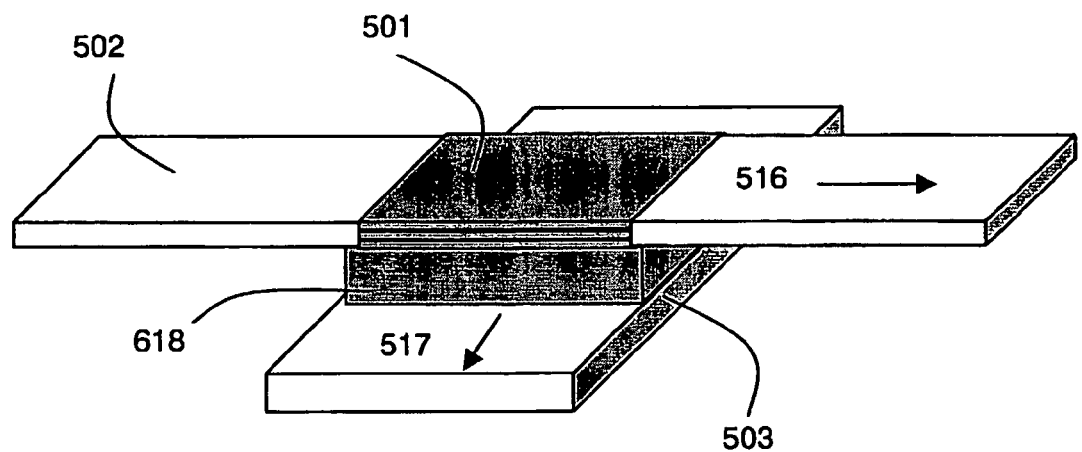
FIG. 6B is a schematic view of the memory cell's writing by applying the current along the bit line and the word line after the memory cell is heated by the heat element of FIG. 6A.

In FIG. 6B the memory cell's writing operation is shown by applying a current 516 along the bit line 502 and a current 517 along the word line 503 after the memory cell 501 is heated by the heat element 618. The currents 516, 517 along the bit line 502 and the word line 503, respectively, induce a magnetic field, which is used to set the common magnetization vector of the recording layer of the memory cell 501. When multiple memory cells 501 are formed into an array in a MRAM device, it is possible that the heat element 618 will also partially heat other memory cells because of a shunting effect. As it would be known to a person of ordinary skill in the art, in order to suppress the shunting effect, a diode, field-effect transistor (FET), CMOS transistor, or other non-linear element (NLE) can be integrated with the heat element 618.

Figure 7A:
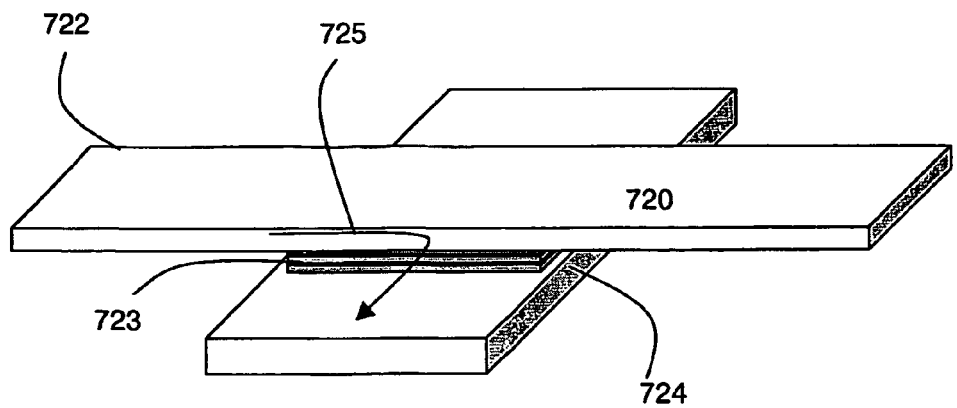
FIG. 7A is a schematic view of a CPP MRAM structure heated by a current through a CPP memory cell in accordance with the second embodiment of the invention.
Figure 7B:
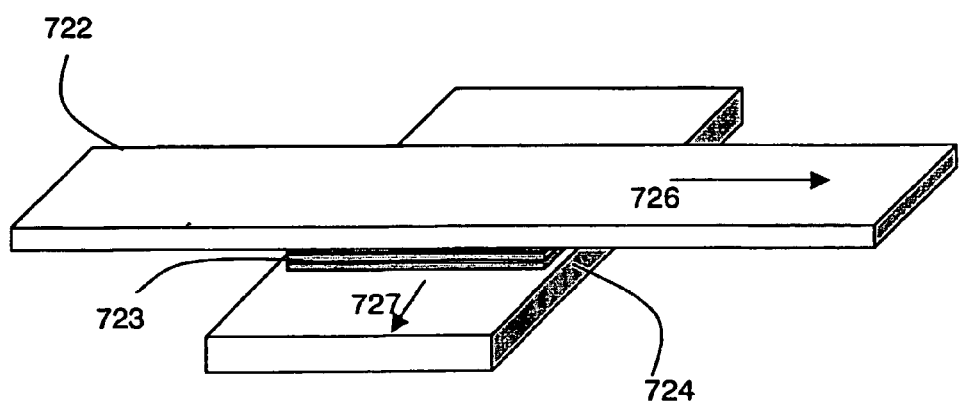
FIG. 7B is a schematic view of the CPP memory cell's writing by applying the current along the bit line and the word line after the CPP memory cell is heated in accordance with the second embodiment of the invention.

Referring now to FIGS. 7A and 7B, a CPP type MRAM structure according to the second embodiment of the present invention is shown, similar to the CIP structure in FIGS. 6A and 6B. In FIG. 7A, the CPP (MTJ or CPP SV) MRAM structure comprises a CPP memory cell 723 which is already described in detail in FIG. 4B as memory cell 410, a bit line 722 and a word line 724. An initial heating current 725 is applied to the CPP memory cell 723 by the bit line 722 and the word line 724.

The writing operation of a CPP memory cell 723 in a MRAM is similar to the writing operation of the CIP memory cell 501 described earlier with respect to FIG. 5B. FIG. 7B illustrates the memory cell's writing operation wherein currents 726, 727 are applied along the bit line 722 and the word line 724, respectively, after the memory cell 723 is heated by an initial heating current 725.

Figure 8A:
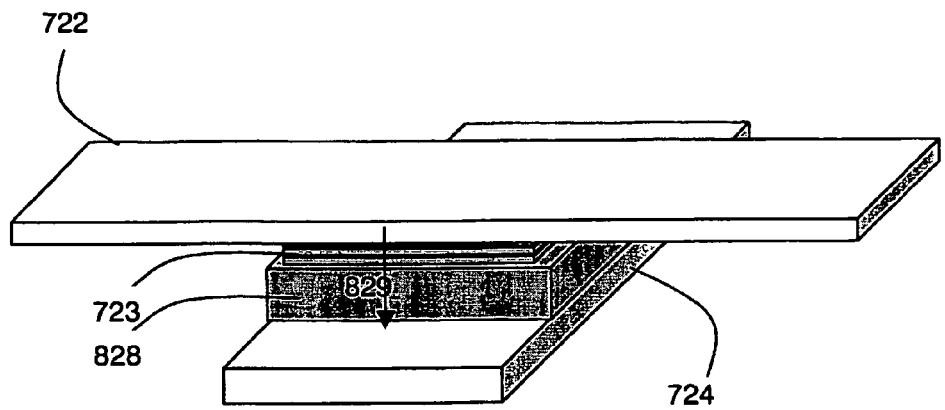
FIG. 8A is a schematic view of a CPP MRAM structure heated by a current through a CPP memory cell and heat element in accordance with a fourth embodiment of the invention.
Figure 8B:
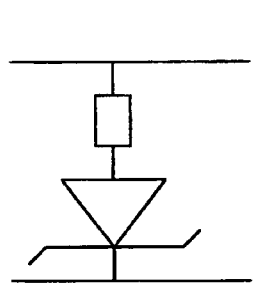
FIG. 8B is a schematic view of an equivalent circuit of the CPP MRAM structure heated by the current through the CPP memory cell and a Zener diode of FIG. 8A.

In a fourth embodiment of the present invention, a CPP MRAM is shown in FIG. 8A, wherein a heat element 828 is provided under the memory cell 723 of the second embodiment of the present invention and wherein the CPP MRAM structure is heated by a current 829 flowing through the CPP memory cell 723 and a heat element 828. The components of the memory cell 723 are analogous to those of previously described memory cell 410. The heat element 828 can be a non-linear element, such as a Zener diode, a FET or any other suitable non-linear element. An equivalent circuit of a MTJ memory cell integrated with a Zener diode is illustrated in FIG. 8B. Details about the usage of a Zener diode as non-linear heating element are described in the international patent application PCT/SG03/00045, the disclosure of which is incorporated herein in its entirety.

Figure 8C:
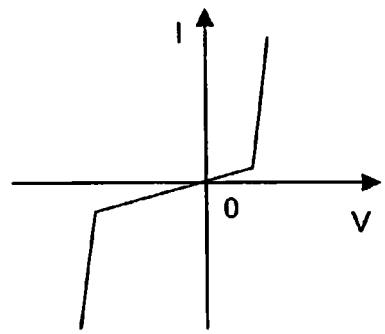
FIG. 8C is an illustration of an I-V curve of a Zener diode.

As shown in FIG. 8C, an I-V curve of a Zener diode is illustrated. The maximum heating power ($P_{max}$) is equal to $V_d \times V_b/R_m + V_b \times V_b/R_m$ wherein $V_d$ is the voltage applied across the Zener diode, $V_b$ is the breakdown voltage of the memory cell, and $R_m$ is the memory cell resistance. In the forward biased state, the low voltage drop across the Zener diode can be used to select a particular memory cell during reading. The Zener diode can also serve as a memory cell selector while writing. The typical voltage drop is about 0.7 V and the typical breakdown voltage is about 1 V for a MTJ memory cell. In operation, the power from these voltage drops may not be sufficient to heat the recording layer. However, in the reverse biased state, the breakdown voltage of the Zener diode can be larger than 4 V. The large voltage drop in this instance can be used to heat the Zener diode, and thereby heat the recording layer. The other unselected Zener diodes in the MRAM device are biased below the breakdown voltage, so there is no shunt current flowing through the other unselected memory cells and Zener diodes. Thus, the shunting effect even while heating the memory cell can also be suppressed sufficiently by introducing a non-linear element such as Zener diodes or other FETS and diodes.

Figure 8D:
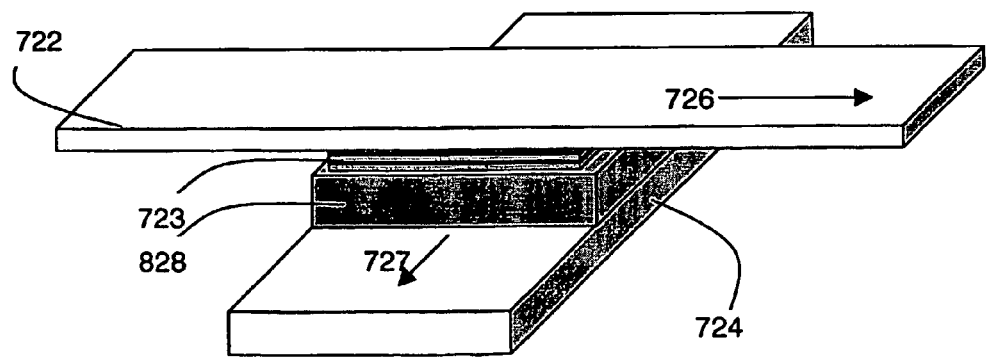
FIG. 8D is a schematic view of the CPP memory cell's writing by applying the current along the bit lines and the word lines after the CPP memory cell is heated by the heat element and itself in accordance with the fourth embodiment of the invention.

Referring to FIG. 8D, a CPP memory cell's writing operation is shown similar to the writing operations described above with respect to FIG. 7B, wherein currents 726, 727 are applied along the bit line 722 and the word line 724, respectively, after the memory cell 723 is heated by the heat element 828.

Figure 9:
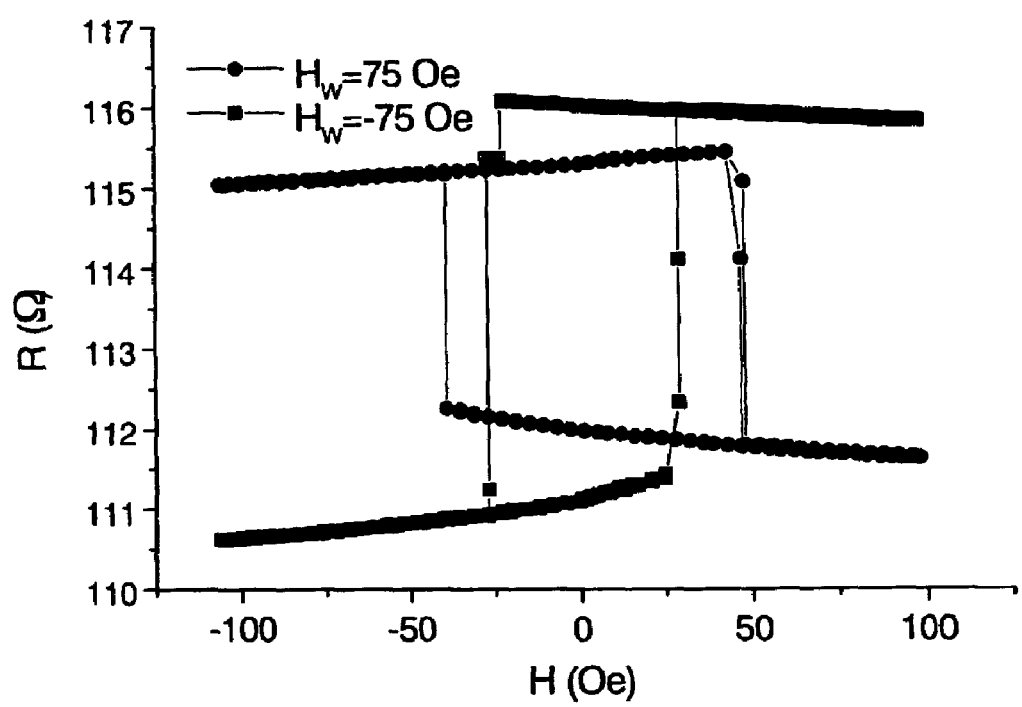
FIG. 9 is a view of the MR-H curves of a MRAM cell.

FIG. 9 shows an experimental result for magnetoresistance curves of a magnetic memory device according to the first embodiment of the present invention which was shown in FIG. 3B. The X-axis represents the external field H (Oe), and the Y-axis represents the magnetic resistance R (ohm or Ω).

These magnetoresistance curves demonstrate writing to a memory cell of a SAFP MRAM and reading from the memory cell according to the present invention. After heating the memory cell by means of a heating current of 3 mA, and followed by applying a writing field of $H_w$=75 Oe, which can be generated by means of writing currents, the resistance measurable across the memory cell 310 decreases as the external field increases (shown as circle line), which means the magnetization vector of the pinned first ferromagnetic layer 313 is oriented rightward. However, after heating the memory cell 310 by means of a heating current of 3 mA, and followed by applying a writing field of $H_w$=−75 Oe, the resistance measurable across the memory cell 310 increases as the external field increases (shown as rectangular line), which means the magnetization vector of the pinned first ferromagnetic layer 313 is oriented leftward. These magnetoresistance curves show that the orientation of the magnetization vector of the pinned first ferromagnetic layer 313 can be set by combining the heating and writing fields or currents, and the magnetization vector direction of 313 can be detected by changing the magnetization of the free layer 311.

Whilst the present invention has been described with reference to preferred embodiments it should be appreciated that modifications and improvements may be made to the invention without departing from the scope of the invention as defined in the following claim.

What is claimed is:

1. A magnetoresistive random access memory (MRAM) unit comprising:
    a substrate;
    a plurality of memory cells formed on said substrate; and
    a plurality of electrical wires electrically coupled to said plurality of memory cells;
        wherein each of said plurality of memory cells comprises a synthetic antiferromagnetic pinned (SAFP) recording layer, wherein said SAFP recording layer comprises two or more antiferromagnetically coupled ferromagnetic layers pinned by at least one antiferromagnetic layer, and
    wherein said plurality of memory cells together with said plurality of electrical wires are adapted for a heating current flowing therethrough to heat a respective one of said plurality of memory cells and wherein said plurality of electrical wires is adapted for writing currents flowing therethrough to change a magnetization of said SAFP recording layer of said heated respective one of said plurality of memory cells.

2. The MRAM unit according to claim 1, wherein between each two neighboring ferromagnetic layers of said two or more antiferromagnetically coupled ferromagnetic layers a non-magnetic space layer is sandwiched.

3. The MRAM unit according to claim 1, wherein each of said plurality of memory cells further comprises a free magnetic layer and a cap layer.

4. The MRAM unit according to claim 1, further comprising a plurality of heat elements, each of said plurality of heat elements being thermally coupled, respectively, to each of said plurality of memory cells.

5. The MRAM unit according to claim 4, wherein each of said plurality of heat elements is adapted to heat said respective one of said plurality of memory cells to a value approaching or exceeding the critical temperature of said SAFP recording layer.

6. The MRAM unit according to claim 4, wherein each of said plurality of heat elements is a non-linear element.

7. The MRAM unit according to claim 6, wherein said non-linear element is one of the group comprising: a Zener diode and a field-effect transistor.

8. The MRAM unit according to claim 1, wherein each of said plurality of memory cells is a current-in-plane memory cell.

9. The MRAM unit according to claim 8, wherein said current-in-plane (CIP) memory cells are CIP spin-valve memory cells.

10. The MRAM unit according to claim 1, wherein each of said plurality of memory cells is a current-perpendicular-to-plane (CPP) memory cell.

11. The MRAM unit according to claim 10, wherein said CPP memory cells are magnetic tunnel junction memory cells.

12. The MRAM unit according to claim 10, wherein said CPP memory cells are CPP spin-valve memory cells.

13. The MRAM unit according to claim 1, wherein said free magnetic layer comprises magnetic material with higher critical temperature than that of said SAFP recording layer.

14. A method of writing data in a MRAM unit which comprises a plurality of memory cells, a bit line and a word line both in electrical contact with said plurality of memory cells, each of said plurality of memory cells comprising a synthetic antiferromagnetic pinned (SAFP) recording layer, said SAFP recording layer comprising two or more antiferromagnetically coupled ferromagnetic layers pinned by at least one antiferromagnetic layer, said method comprising:
  raising the temperature of said SAFP recording layer in an individual memory cell to a value approaching or exceeding its critical temperature independently of other memory cells, thereby reducing the coercitivity of said SAFP recording layer; and
  writing a magnetization state in said SAFP recording layer of said individual memory cell by passing a first current completely through said bit line and by passing a second current completely through said word line.

15. The method according to claim 14, further comprising cooling down said SAFP recording layer in said individual memory cell to nearly ambient temperature after writing said magnetization state in said SAFP recording layer of said individual memory cell.

16. The method according to claim 14, wherein raising the temperature of said SAFP recording layer in said individual memory cell to a value approaching or exceeding its critical temperature independently of other memory cells further comprises passing a heating current partly through said bit line, completely through said individual memory cell and partly through said word line.

17. The method according to claim 16, said method further comprising providing a heating element adjacent said individual memory cell before said step of raising the temperature of said SAFP recording layer in said individual memory cell to a value approaching or exceeding its critical temperature independently of other memory cells.

18. The method according to claim 17, wherein passing a heating current partly through said bit line, completely through said individual memory cell and partly through said word line further comprises also passing said heating current completely through said heating element.

19. The method according to claim 17, said method further comprising providing a non-linear element as heating element.

20. The method according to claim 19, said method further comprising providing a Zener diode or a field-effect transistor as non-linear element.

21. A method of performing a read operation in a MRAM unit which comprises a plurality of memory cells, a bit line and a word line both in electrical contact with the plurality of memory cells, each of said plurality of memory cells comprising a synthetic antiferromagnetic pinned (SAFP) recording layer and a free magnetic layer, said SAFP recording layer comprising two or more antiferromagnetically coupled ferromagnetic layers pinned by at least one antiferromagnetic layer, the method comprising:
  applying currents through said bit line and said word line; and
  determining the magnetization state of said SAFP recording layer, wherein the resistance states of said SAFP recording layer are dependent on the relative angles between the magnetization vectors of said SAFP recording layer and said free magnetic layer.

* * * * *